(12) United States Patent
Nakamura et al.

(10) Patent No.: US 8,256,107 B2
(45) Date of Patent: Sep. 4, 2012

(54) METHOD OF MANUFACTURING ELECTRONIC-PARTS PACKAGE

(75) Inventors: Takahiko Nakamura, Chiba (JP); Keiji Sato, Chiba (JP); Hitoshi Takeuchi, Chiba (JP); Kiyoshi Aratake, Chiba (JP); Masashi Numata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 354 days.

(21) Appl. No.: 12/547,917

(22) Filed: Aug. 26, 2009

(65) Prior Publication Data

US 2010/0053918 A1    Mar. 4, 2010

(30) Foreign Application Priority Data

Aug. 27, 2008 (JP) ................. 2008-218427

(51) Int. Cl.
*H05K 3/30* (2006.01)

(52) U.S. Cl. ............... 29/832; 29/840; 29/842; 29/852

(58) Field of Classification Search .............. 29/825, 29/830, 832, 840, 852, 842

See application file for complete search history.

(56) References Cited

U.S. PATENT DOCUMENTS 4,604,677 A * 8/1986 Suzuki et al. ............. 361/729

FOREIGN PATENT DOCUMENTS

| JP | 11-302034 A | 11/1999 |
|---|---|---|
| JP | 2003-209198 A | 7/2003 |
| JP | 2007-324303 | * 12/2007 |

* cited by examiner

*Primary Examiner* — Carl Arbes
(74) *Attorney, Agent, or Firm* — Brinks Hofer Gilson & Lione

(57) ABSTRACT

An electronic-parts package includes a base member, a conductive member extending through the base member, the conductive member having the insulating substance on the surface removed by polishing, electronic parts disposed on one surface of the conductive member through a connection portion, an exterior electrode disposed through a metal film on the opposite surface of the surface of the base member on which the electronic parts is disposed, and a cap member that protects the electronic parts on the base member.

3 Claims, 6 Drawing Sheets

(B-1)

(B-2)

(C)

(F-1)

(F-2)

(F-3)

110

120

130

140

100
160
150

METHOD OF MANUFACTURING ELECTRONIC-PARTS PACKAGE

RELATED APPLICATIONS

This application claims priority under 35 U.S.C. §119 to Japanese Patent Application No. JP2008-218427 filed on Aug. 27, 2008, the entire content of which is hereby incorporated by reference.

BACKGROUND OF THE INVENTION

The present invention relates to a package, which accommodates electronic parts as typified by a crystal resonator or a piezoelectric element.

Because a crystal resonator has an excellent characteristic in frequency, it is often used as a device, more specifically, as one of the components to be mounted on a printed substrate. However, in order to stabilize the characteristic of the crystal resonator, it is desirably placed within a closed housing for shutting off the influence by outside air. An example of such a package structure has been proposed in "Garasu-Seramikku Fukugotai oyobi Sorewo Mochiita Furatto Pakkeji Gata Atsuden Buhin (Glass-Ceramic Composite and Flat Package Type Piezoelectric Parts Using The Same)" (which will be called Patent Document 1).

According to Patent Document 1, a package in which a quartz piece is accommodated in a base member and is covered with a cap member is characterized in that the package is formed by a material having a substantially equal coefficient of thermal expansion to that of the quartz piece. That is, the package is made of ceramics with a mix of glass powder.

However, because the package according to Patent Document 1 is made of a glass-ceramic composite, it is manufactured by using single part production in which a quartz piece is mounted on one base member and is covered with a cap member, which may significantly lower the productivity. In addition, the glass-ceramic composite is difficult to process, which may increase the production cost.

In order to overcome the drawback, methods that manufacture the package from easy-processable glass have been disclosed, and an "electronic-parts package" (refer to Patent Document 2), for example, has been disclosed.

With reference to FIGS. 6A to 6F, the outline of Patent Document 2 will be described where FIGS. 6A to 6F correspond to steps (a) to (f), respectively. According to Patent Document 2, a method has been proposed which produces an electronic-parts package 100 through a step (a) of forming a through-hole on a base member 110, a step (b) of pouring low-melting glass to the through-hole and inserting a metal pin 120 thereto, a step (c) of squeezing the metal pin 120 thereinto and processing the glass plate to a concave shape, a step (d) of forming an electrode 130 by printing, a step (e) of mounting parts 140 such as a crystal resonator to the metal pin, and a step (f) of sealing a cap member 160 and the base member 110 through a sealing agent 150. Among them, in the step (c), the glass is welded at the heating temperature equal to or higher than the softening point temperature (approximately 1000° C.) of glass so that the metal pin 120 can be sealed to the base member 110. Therefore, the airtightness can be certainly kept in the step (f), which allows the production at low costs.

[Patent Document 1] JP-A-11-302034
[Patent Document 2] JP-A-2003-209198

The step (c) of the manufacturing method for the electronic-parts package 100 has a problem shown in FIGS. 7A to 7C. That is, because, as shown in FIG. 7A, the metal pin 120 is covered by the low-melting glass 170 when the metal pin 120 is short or is squeezed thereinto less, the electric connection between the metal pin 120 and the electrode 130 formed in the step (d) may not be obtained. Furthermore, as shown in FIG. 7B, even when the metal pin 120 is squeezed thereinto as designed, the base member 110 is exposed to the temperature equal to or higher than the softening point. Therefore, there is concern that the glass may cover the tip of the metal pin 120. There is still another problem that, as shown in FIG. 7C, because the metal pin 120 is exposed to a temperature of approximately 1000° C., an oxide film 180 may grow around the metal pin 120, which may bring the electrode 130 and the electronic parts 140 out of conduction.

SUMMARY OF THE INVENTION

In order to solve the problems, according to the invention, there is provided an electronic-parts package including a base member of glass on which electronic parts is mounted, a cap member that covers the base member, electronic parts mounted on the base member, and a conductive member that electrically connects an exterior electrode provided on the opposite side of the parts mounted on the base member. In this case, the base member and the conductive member are welded and then are polished. After that, a connection portion is formed thereon that electrically connects the conductive member and the electronic parts, and a metal film is provided on the surface of the conductive member on the exterior electrode side. Thus, the growth of an oxide film can be prevented on the surface of the conductive member after the oxide film produced in welding is removed. Therefore, the conduction between the electronic parts and the exterior electrode can be obtained.

The metal film on the surface of the conductive member has on the outermost surface a substance of any one of precious metals of gold, silver, platinum, palladium, rhodium, iridium, ruthenium and osmium. Thus, the surface covered with the metal film having a low tendency of ionization may allow the formation of the exterior electrode thereon in a more stable manner, and the conduction between the electronic parts and the exterior electrode can be obtained.

The conductive member is any one of an iron-nickel alloy, a kovar alloy and an iron-nickel-chrome alloy, and the metal film is produced by using nickel substitution electroless plating. Thus, the precious metal film can be directly formed with high adherence, without providing any adhesive layer or a barrier layer in the conductive member. This can minimize the damage on other members such as low-melting glass in the electronic-parts package, and the metal film can be formed by a less number of steps. As a result, the necessity for the mask, which is required for film forming by normal sputtering, can be eliminated, and the conduction between the electronic parts and the exterior electrode can be obtained at low costs.

The metal film is produced by firing metal fine particles. Thus, the method that renders metal fine particles by ink-jet and then fires them can be adopted, which can eliminate the necessity for the mask required for film forming by normal sputtering. Therefore, the conduction between the electronic parts and the exterior electrode can be obtained at low costs.

According to the invention, after the oxide film produced on the conductive member when the base member and the conductive member are welded is removed, the electric connection between the conductive member and the electronic parts and the electric connection between the conductive member and the exterior electrode are obtained by providing a precious metal film over the surface of the conductive member without using a mask. This provides an advantage that the conduction between the electronic parts and the exterior electrode can be kept in a stable manner, and the electronic parts package can be produced at low costs.

DETAILED DESCRIPTION OF THE PREFERRED EMBODIMENTS

Figure 1:
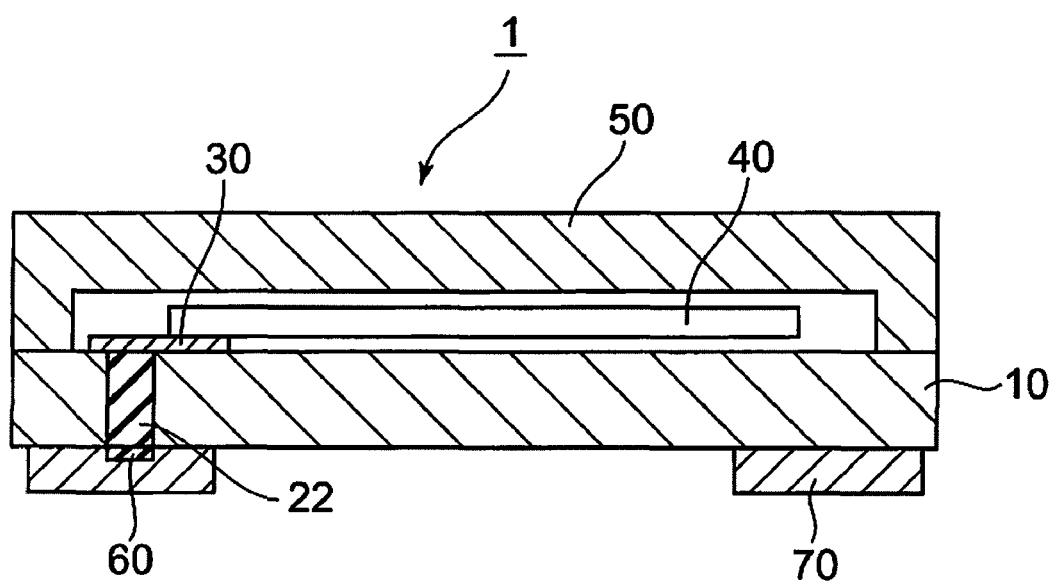
FIG. 1 is a section view of the electronic-parts package according to the invention.

With reference to drawings, an embodiment of the invention will be described. FIG. 1 is a section view of an electronic-parts package according to the invention. In an electronic-parts package 1, electronic parts 40 is mounted in an internal part enclosed by a base member 10 of glass and a cap member 50. The electronic parts 40 is electrically connected to an exterior electrode 70, which is a terminal mounted on the substrate, through a connection portion 30, a conduction-providing conductive member 22 and a metal film 60.

The connection portion 30 includes a circuit pattern on the base member 10 and contains one resulting from firing a conductive adhesive such as a silver paste. However, the connection portion 30 may not contain a conductive adhesive in some configuration of the electronic parts 40.

The conductive member 22 may be an iron-nickel alloy, a kovar alloy or an iron-nickel-chrome alloy, for example. However, the conductive member 22 may be any of other metal and be one having a closer thermal expansion coefficient as that of the base member 10 for prevention of the damage by the heat history.

The metal film 60 contains, on the outermost surface, precious metal such as gold, silver, platinum, palladium, rhodium, iridium, ruthenium, and osmium. Because precious metal has a low tendency of ionization and has protection against corrosion, the deterioration in the time until the exterior electrode is formed and/or the deterioration due to overheat after the metal film 60 is provided on the substrate can be suppressed. Thus, the precious metal can make the metal film 60 reliable as a product. In order to obtain the adherence with the conductive member 22, the metal film 60 may have a metal film of chrome or titanium, for example, as the undercoat for the precious metal on the outermost surface. Furthermore, in order to prevent metal diffusion, a metal film of nickel, for example, may be formed between the undercoat layer and the precious metal film as a diffusion barrier layer. The metal film is generally formed by sputtering but may be formed by plating. The conductive member 22 containing a nickel component allows the omission of the processing by normal plating by directly using nickel substitution electroless plating for forming the metal film 60. The plating is only performed on the conductive member, which can reduce the cost.

The material of the exterior electrode 70 has high quality in the sputtered film, but the base member 10 is brittle. Therefore, it is better to use a conductive adhesive such as a silver paste that alleviates the stress when the exterior electrode 70 is formed.

The section view in FIG. 1 shows one electronic-parts package 1, but the electronic parts package 1 are produced using a wafer and are cut off from each other by dicing, for example, at the end, rather than a package to be manufactured one by one. Next, the manufacturing method will be described with reference to FIG. 2A to FIG. 5C.

FIGS. 2A to 2H are diagrams showing manufacturing steps for an electronic-parts package according to the invention.

Figure 2A:
FIGS. 2A to 2H are diagrams showing the manufacturing steps for the electronic-parts package according to the invention.

FIG. 2A shows a step of forming a through-hole on the base member 10. The through-hole may be produced by sandblast processing, laser processing, drilling processing or heat press processing, for example.

Figure 2B:
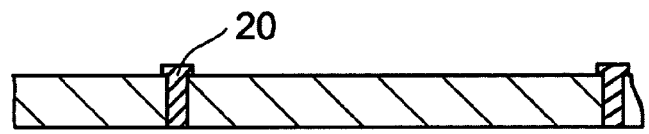

FIG. 2B shows a step of coating low-melting glass, not shown, over the through-hole and inserting and welding the conductive member 20 thereto. In order to prevent the conductive member 20 from dropping from the hole, the conductive member 20 is T-shaped. At that time, the conductive member 20 may have a state as shown in either FIG. 3A or 3B. In order to allow the glass welding, 400 to 500° C., which is the temperature at which at least low-melting glass melts, is required. When low-melting glass is not used, a temperature equal to or higher than the glass softening point temperature (that is approximately 1000° C.) of the base member 10 is required. Therefore, an oxide film 90 is generated on the place not covered by the base member 10 and low-melting glass 80, as shown in FIGS. 3A and 3B, which prevents the conduction.

Figure 2C:
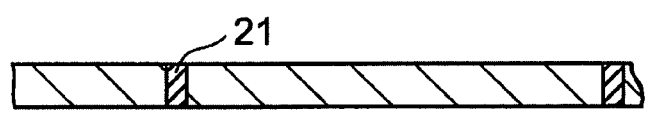
Figure 3A:
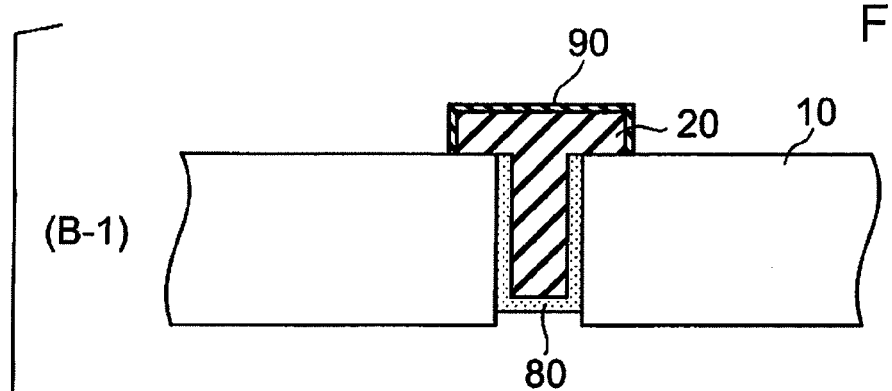
FIGS. 3A and 3B are enlarged section views of the conductive member of the electronic-parts package according to the invention.
Figure 3B:
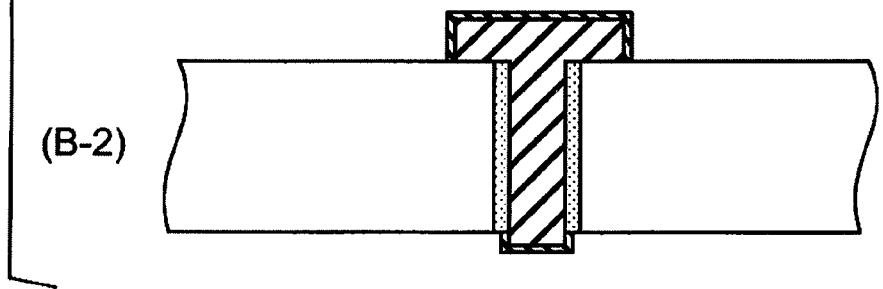
Figure 4:
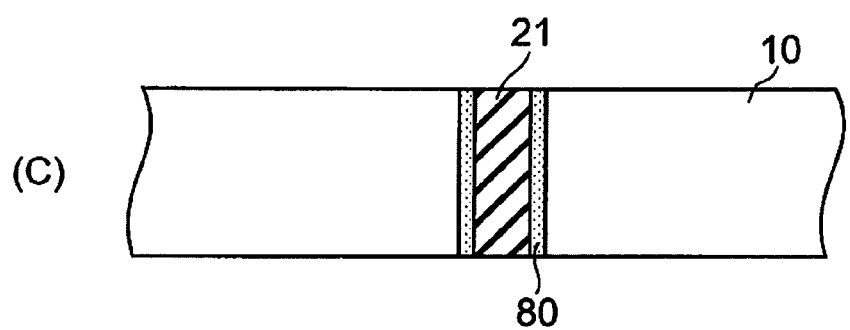
FIG. 4 is an enlarged section view of the conductive member of the electronic-parts package according to the invention.

FIG. 2C shows a step of removing the T-shaped head part of the conductive member 20, the oxide film 90 covering the T-shaped part shown in FIGS. 3A and 3B and the low-melting glass 80, which can be implemented by polishing thinly the base member 10 including the conductive member 20. Thus, as shown in the enlarged view in FIG. 4, the oxide film 90 and the low-melting glass covering the conductive member 20 are removed, and the top and bottom parts of the base member 10 can be brought into conduction through the conductive member 21.

Figure 2D:

FIG. 2D shows a step of mounting the electronic parts 40 through the connection portion 30 including a circuit pattern. At that time, the conductive member 21 on the side where the electronic parts 40 is to be mounted is covered by the connection portion 30. Therefore, the concern about the growth of an oxide film, for example, can be eliminated, and the conduction can be obtained.

Figure 2E:
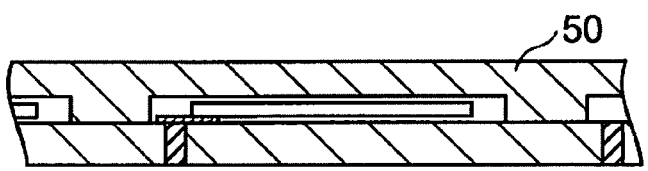

FIG. 2E is a step of jointing the cap member 50 processed to a concave shape with the base member 10. The material of the cap member 50 may be selected in consideration of the specifications, such as the degree of vacuum and costs, required by the jointing method and the electronic parts 40, for example. When the electronic parts 40 is a crystal resonator and is adjusted in frequency after the base member 10 and the cap member 50 are jointed, a member of glass may be selected as the cap member 50, for example.

Figure 2F:
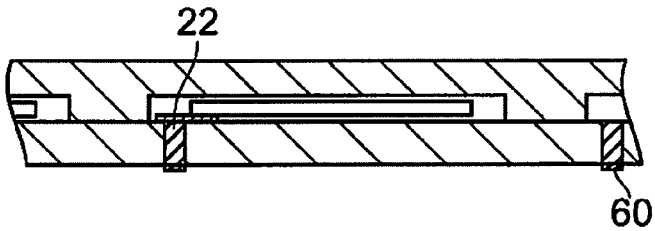
Figure 5A:
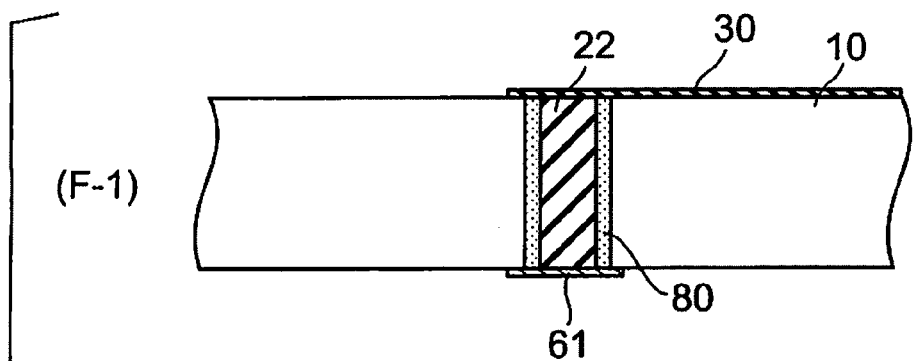
FIGS. 5A to 5C are enlarged section views of the conductive member of the electronic-parts package according to the invention.
Figure 5B:
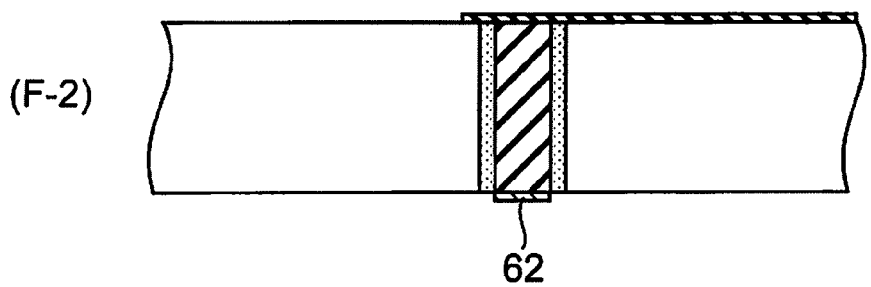
Figure 5C:
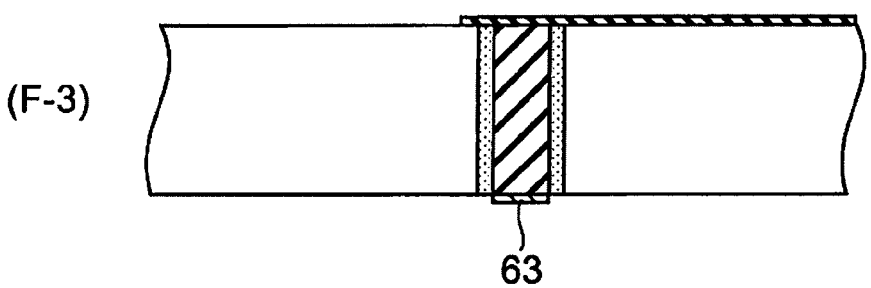
Figure 6A:
FIGS. 6A to 6F are manufacturing steps of a conventional example.
Figure 6B:
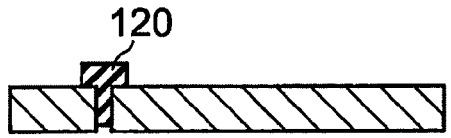
Figure 6C:
Figure 6D:
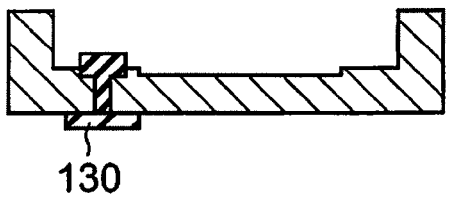
Figure 6E:
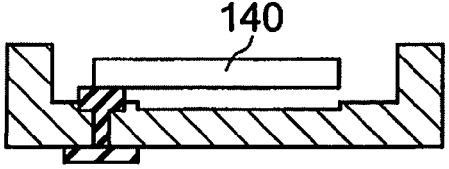
Figure 6F:
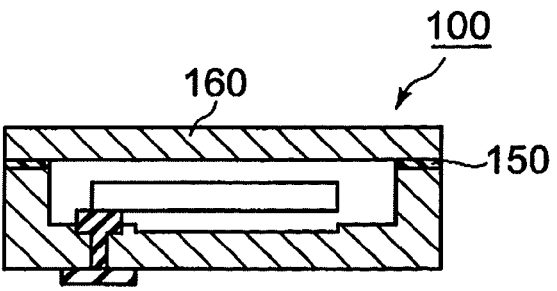
Figure 7A:
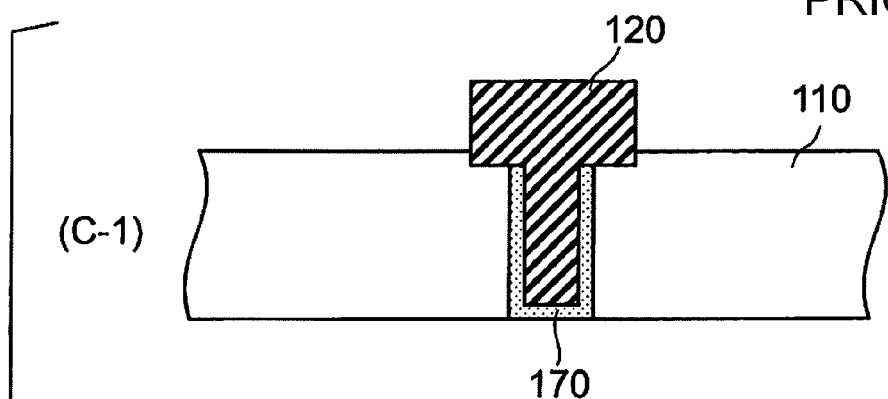
FIGS. 7A to 7C are enlarged section views of a metal pin portion of the conventional example.
Figure 7B:
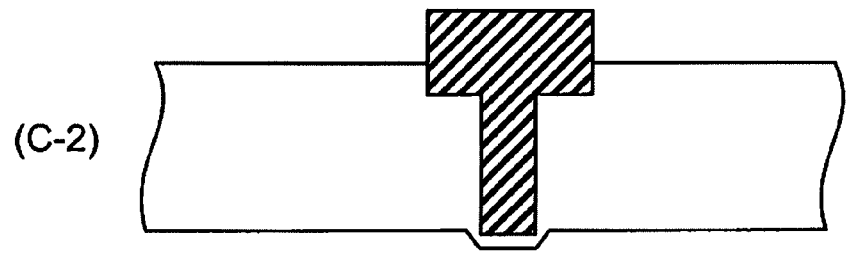
Figure 7C:
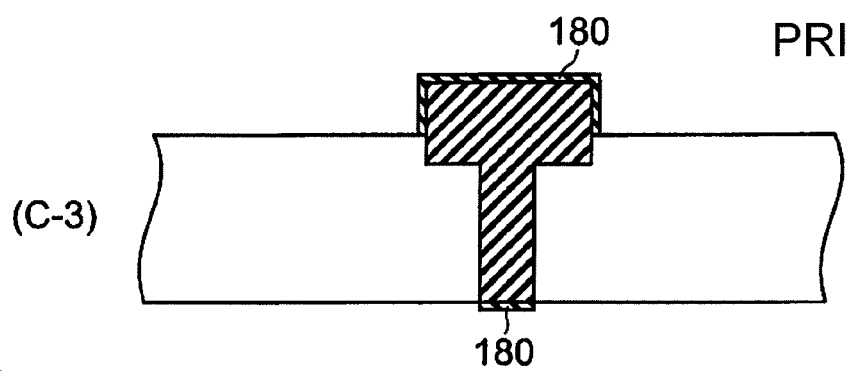

FIG. 2F shows a step of forming the metal film 60 on the surface of the conductive member 22. Because it is heated in the step shown in FIG. 2E, there is a possibility that an oxide film grows again in some jointing method selected. FIGS. 5A to 5C show enlarged views of FIG. 2F. In FIG. 5A, a sputtered film 61 is provided on the exterior electrode side. However, before the film is sputtered, reverse sputtering may be performed to remove the oxide film. Thus, the conduction across the base member 10 can be obtained. In FIG. 5B, a film is formed by plating. By performing electroless plating, a plated film 62 is formed only on the end face of the conductive member 22. The oxide film formed in the step shown in FIG. 2E may be cleaned chemically for complete removal before plating. FIG. 5C is a diagram showing a metal film 63 formed by firing metal fine particles. The metal fine particles are scattered in a solution for coating by an ink-jet apparatus. Therefore, by mapping the position of the conductive member 22 in advance, the metal film 63 resulting from the firing of the metal fine particles may be formed only on the end face of the conductive member 22. The oxide film formed in the step shown in FIG. 2E is removed by chemical cleaning before coating. The steps shown in FIGS. 5B and 5C do not require a mask, which costs less than sputtering. In this way, the method for forming the metal film 60 is selected in accordance with whether chemical cleaning is to be applied or not in the step shown in FIG. 2F.

Figure 2G:
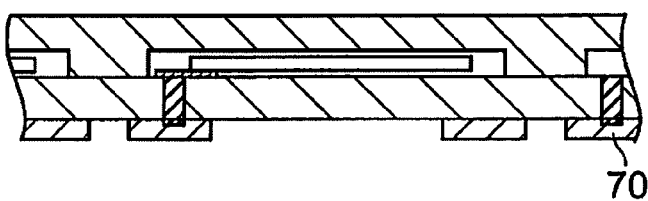

FIG. 2G shows a step of forming the exterior electrode 70. The exterior electrode 70 is formed by the sputtering or by printing and firing a conductive adhesiveness. Furthermore, the sputtered film may be formed on a conductive resin.

Figure 2H:
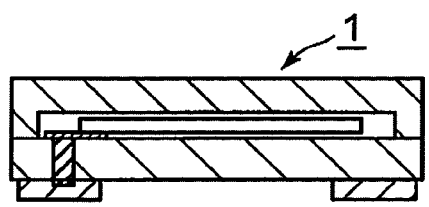

FIG. 2H shows a step of separating it into pieces. More specifically, it is performed by dicing or laser cutting where the separating method may vary in accordance with the material of the cap member 50.

What is claimed is:

1. A manufacturing method for an electronic-parts package comprising the steps of:
    forming a through-hole on a base member;
    coating the through-hole with low-melting glass and inserting and welding a conductive member thereto;
    polishing and thinning the base member including the head part of the conductive member projecting from the base member and removing an insulating layer such as an oxide film covering the head part of the conductive member;
    electrically connecting the conductive member to electronic parts through a connection portion including a circuit pattern;
    jointing a cap member processed to a concave shape with the base member;
    forming a metal film on the surface on the opposite side of the one on which the connection portion of the conductive member is formed; and
    electrically connecting the conductive member and an exterior electrode through the metal film.

2. The manufacturing method for an electronic-parts package according to claim 1, wherein the conductive member is any one of an iron-nickel alloy, a kovar alloy and an iron-nickel-chrome alloy, and the metal film is produced by using nickel substitution electroless plating.

3. The manufacturing method for an electronic-parts package according to claim 1, wherein the metal film is produced by firing metal fine particles.

* * * * *